United States Patent [15] 3,683,202

Schmidt, Jr. [45] Aug. 8, 1972

[54] COMPLEMENTARY METAL OXIDE SEMICONDUCTOR EXCLUSIVE NOR GATE

[72] Inventor: Bernard H. Schmidt, Jr., Mesa, Ariz.

[73] Assignee: Motorola, Inc., Franklin Park, Ill.

[22] Filed: Dec. 28, 1970

[21] Appl. No.: 101,734

[52] U.S. Cl. ....................307/205, 307/215, 307/216
[51] Int. Cl. ........................H03k 19/08, H03k 19/34
[58] Field of Search ........307/205, 215, 216; 328/93, 328/159

[56] References Cited

UNITED STATES PATENTS 3,541,353 11/1970 Seelbach et al........307/215 X

*Primary Examiner*—John Zazworsky
*Attorney*—Mueller & Aichele

[57] ABSTRACT

A complementary metal oxide semiconductor (C-MOS) exclusive NOR gate is shown having a minimum number of devices for performing the exclusive NOR function. The exclusive NOR function is performed by utilizing the normal two input signals as logic indicating signals and generating a control signal which is a complement of one of the two logic signals. A different configuration results with the selection of the logic signal from which the control signal is to be generated. The capacitance of the output node or output signal is charged by any one of a plurality of current paths associated with each logic configuration.

20 Claims, 13 Drawing Figures

EXCLUSIVE NOR WITH INVERTER ON A INPUT SIGNAL

| | A | B | A ⊙ B |
|---|---|---|---|
| (a) | 0 | 0 | 1 |
| (b) | 0 | 1 | 0 |
| (c) | 1 | 0 | 0 |
| (d) | 1 | 1 | 1 |

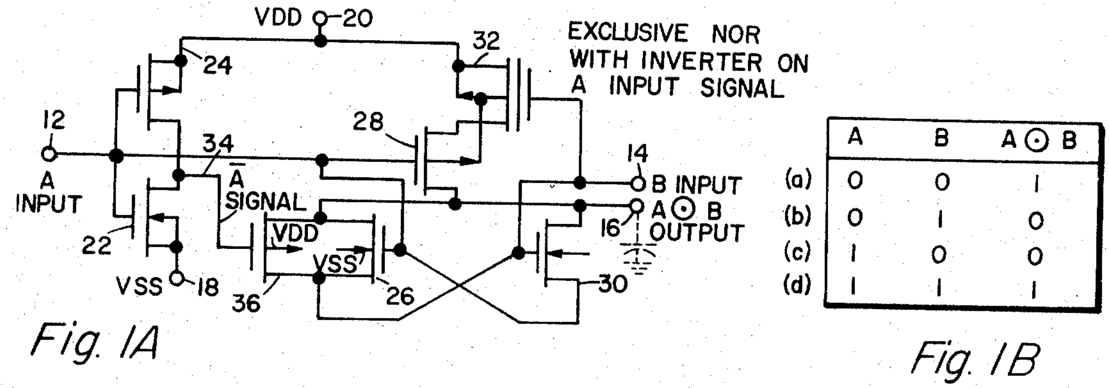
Fig. 1A
| | A | B | A ⊙ B |
|---|---|---|---|
| (a) | 0 | 0 | 1 |
| (b) | 0 | 1 | 0 |
| (c) | 1 | 0 | 0 |
| (d) | 1 | 1 | 1 |
Fig. 1B
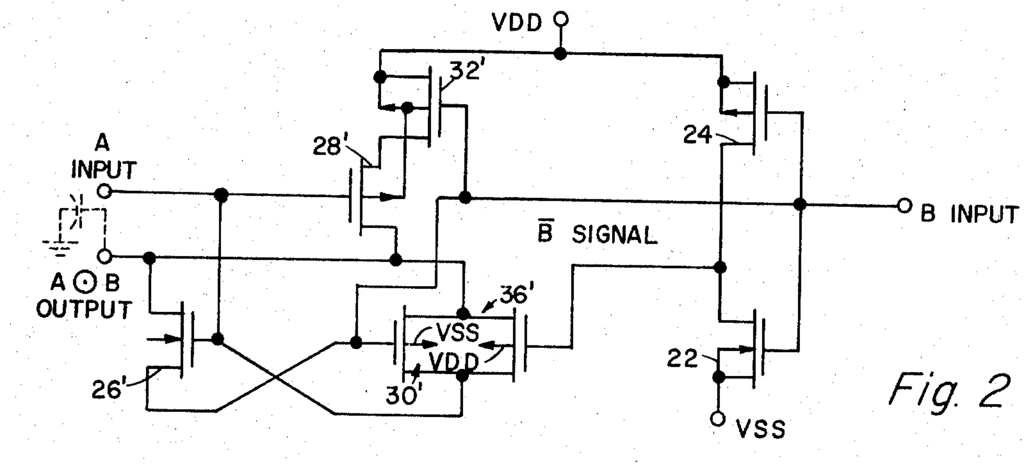
Fig. 2
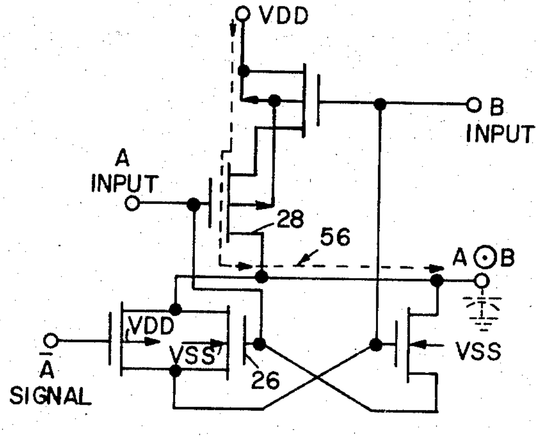
Fig. 3A
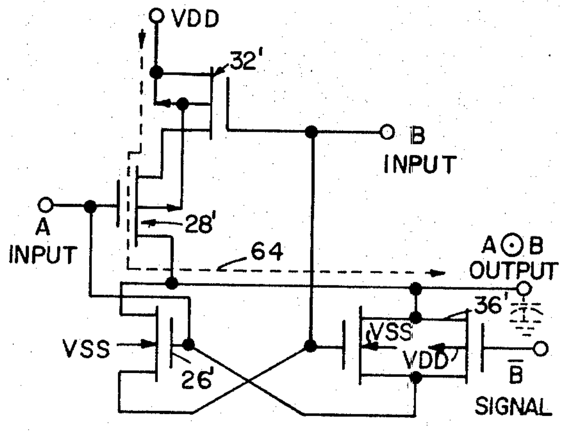
Fig. 3B
| (Ā OR B̄) | A | B | A ⊙ B |
|---|---|---|---|
| 1 | 0 | 0 | 1 |
Fig. 3C
INVENTOR.
Bernard H. Schmidt Jr
BY
Mueller & Aichele
ATTY'S.

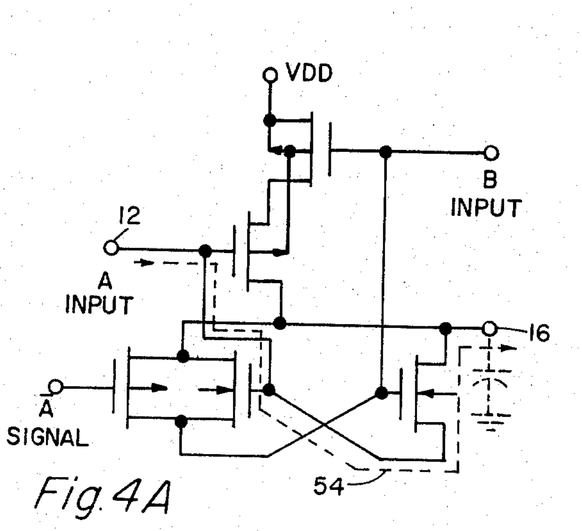
Fig. 4A
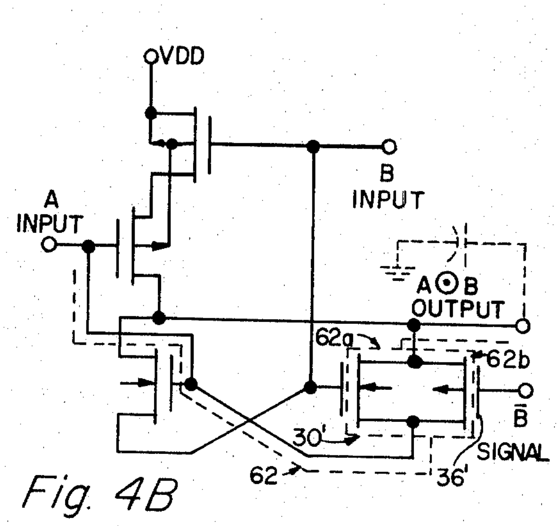
Fig. 4B
| ($\bar{A}$ | $\bar{B}$) | A | B | A⊙B |
|---|---|---|---|---|
| 1 | 0 | 0 | 1 | 0 |
Fig. 4C
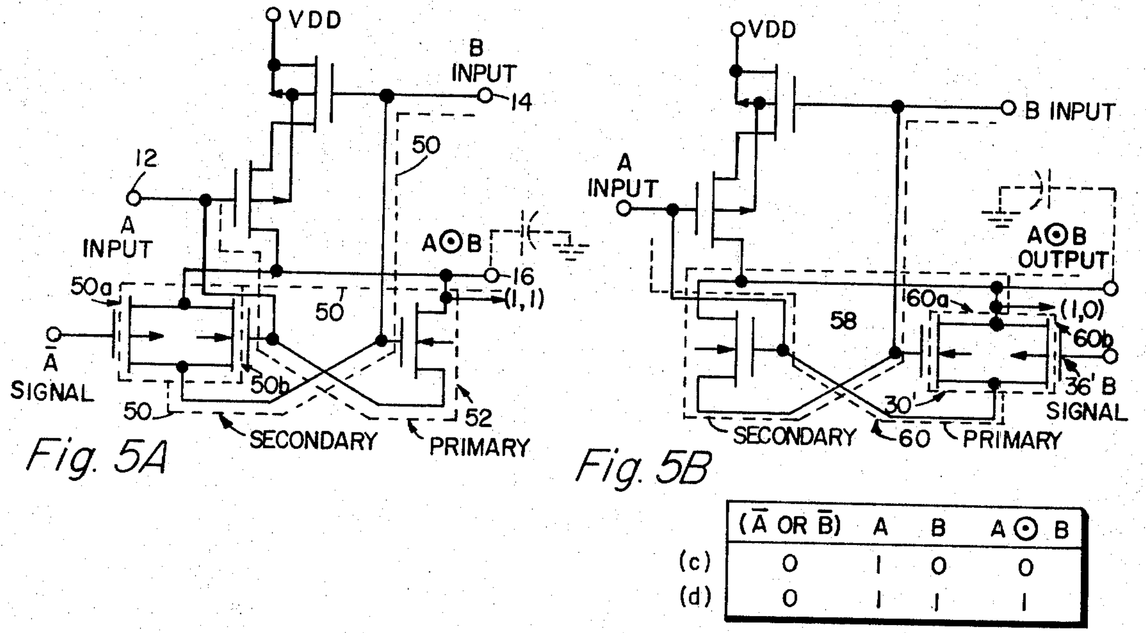
Fig. 5A, Fig. 5B
| | ($\bar{A}$ OR $\bar{B}$) | A | B | A⊙B |
|---|---|---|---|---|
| (c) | 0 | 1 | 0 | 0 |
| (d) | 0 | 1 | 1 | 1 |
Fig. 5C
| INPUTS | | DEVICES | | | | | | | | |
|---|---|---|---|---|---|---|---|---|---|---|
| A | B | 24 | 22 | 32 | 28 | 36 | 26 | 30 | 34 | VOUT |
| 0 | 0 | ON | OFF | ON | ON | OFF | OFF | OFF | VDD | VDD |
| 0 | 1 | ON | OFF | OFF | ON | OFF | OFF | ON | VDD | VSS |
| 1 | 0 | OFF | ON | ON | OFF | ON | ON | OFF | VSS | VSS |
| 1 | 1 | OFF | ON | OFF | OFF | ON | ON | ON | VSS | VDD |
Fig. 6
INVENTOR.
Bernard H. Schmidt Jr
BY Mueller & Aichele
ATTY'S.

COMPLEMENTARY METAL OXIDE SEMICONDUCTOR EXCLUSIVE NOR GATE

BACKGROUND OF THE INVENTION

Prior art CMOS exclusive NOR gate circuits traditionally contained two CMOS NAND gates and an AND gate. Each NOR gate operates to add a logic delay period to the speed of operation of the circuit. More specifically, each level of logic takes a finite time for activating whether it be switching, charging or assuming an electrical state. In the prior art CMOS exclusive NOR circuits, such devices included two logic levels and hence included two logic delay periods.

SUMMARY OF THE INVENTION

The present invention relates to CMOS exclusive NOR gates and, more particularly, relates to a CMOS exclusive NOR gate having a minimum number of components and operating with a minimum number of logic delay periods.

It is an object of the present invention to provide a CMOS exclusive NOR circuit fabricated with a minimum number of devices.

It is a further object of the present invention to provide a CMOS exclusive NOR circuit operating with a minimum number of logic delay periods.

Yet another object of the present invention is to provide a CMOS exclusive NOR circuit which is responsive to two input logic signals and the complement of one of said logic signals, which complement signal operates as a control signal and which complement signal in combination with the two logic signals performs the exclusive NOR function.

A still further object of the present invention is to provide a CMOS circuit specifically designed for operating with two logic signals A and B and a control signal $\overline{B}$, which is the complement of the B input signal.

A further object of the present invention is to provide a CMOS circuit which is designed to operate with two logic signals A and B and a control signal $\overline{A}$ which is the complement of the A input logic signal.

A still further object of the present invention is to provide a CMOS circuit having an inverter stage for generating the required control signal $\overline{A}$ or $\overline{B}$ as the case may be.

These and other objects and features of this invention will become fully apparent upon reading the following description of the accompanying drawings, wherein:

FIG. 1A is a schematic view showing the exclusive NOR circuit having an input inverter responsive to the A logic signal for generating the $\overline{A}$ complement signal;

FIG. 1B is a table showing the exclusive NOR truth table;

FIG. 2 is a schematic view of the CMOS exclusive NOR circuit having an input inverter responsive to the B logic signal for generating the $\overline{B}$ complement signal;

FIG. 3A shows the schematic view of the CMOS exclusive NOR circuitry which responds to two logic signals A and B and a control signal $\overline{A}$, which is a complement of the A logic signal and shows the current path for one of the logic conditions;

FIG. 3B is a schematic view of the CMOS circuit which responds to two logic signals A and B and a control signal $\overline{B}$ which is a complement of the B logic signal and shows the charging path for one of the logic conditions;

FIG. 3C shows the pertinent states of the logic truth table table for the circuits shown with reference to FIGS. 3A and 3B;

FIG. 4A is the same schematic view shown with reference to FIG. 3A and shows the discharging path to the output terminal for the 0–1 logic input signals;

FIG. 4B is the same schematic view as shown with reference to FIG. 3B and shows the discharging path to the output terminal for the 0–1 logic input signals;

FIG. 4C shows the pertinent states of the logic truth table for the circuits shown with reference to FIGS. 4A and 4B;

FIG. 5A shows the same schematic view as shown with reference to FIG. 3A and shows the charging paths for the output signal with reference to the 1–0 and 1–1 logic output signals;

FIG. 5B shows the same schematic view as shown with reference to FIG. 3B and shows the charging path to the output terminal for the 1–0 and 1–1 logic input signals;

FIG. 5C shows the logic truth table for the circuits shown with reference to FIGS. 5A and 5B.

FIG. 6 shows the on-off status of each device shown with reference to FIG. 1A.

DETAILED DESCRIPTION OF THE INVENTION

An exclusive NOR circuit is shown which operates to generate a positive logic level signal when both input logic signals are in the same logic state. Throughout the following description, the use of the term positive signal refers to a signal which is more positive than the other signal or voltage level also used in the circuit description. Basically, a potential source is employed having a first voltage level and a second voltage level and a first of such voltage levels is more positive than the second. More specifically, the more positive voltage level sometimes is a ground potential while the second voltage potential is a negative potential level. A second example of voltage polarity can be described as the first potential level being a positive potential and a second potential level being a ground potential. Obviously, broad combinations of voltage levels are possible for driving the circuits to be described hereinafter. The circuits formed by CMOS devices are identified as enhancement type MOS devices. An enhancement type device is normally off until an activating voltage level is applied to its gate region and forms a channel between the source and drain electrodes of a respective device. The enhancement type MOS device can be a P-Channel enhancement MOS device or an N-channel enhancement MOS device. A negative control voltage greater than the threshold value, negative with respect to the drain electrode causes the P-channel MOS device to turn on or become activated. This turn on is signified by the formation of a channel between the source and drain regions through which charge can flow to charge any capacitive nodes in the circuit when the source and drain electrodes have been furnished with their required potential levels. When a positive signal with respect to the drain electrode of an N-channel device and greater than the threshold value is applied to the gate electrode of that device the N-channel device is turned on or activated since a channel is formed between the source and drain regions of that device. Charge flows across such N-channel device to charge the capacitive nodes in the circuit when source and drain potential levels are effectively connected in the circuit.

Referring to FIG. 1A, there is shown a schematic view of an exclusive NOR circuit having an inverter circuit operating in combination with the A input logic signal. A plurality of terminals 12 and 14 are available as the input logic signal terminals. A first logic signal is applied to the terminal 12 and is identified as the A input logic signal. A second input logic signal is applied to the terminal 14 and is identified as the B input logic terminal. The output signals from the circuit are available at the output terminal 16 which is identified as the exclusive NOR (A $\odot$ B) output signals. The voltage potential signals available for controlling the functioning of the circuit are available at a first voltage potential terminal 18 and a second voltage potential terminal 20. The voltage potential terminal 18 is connected to the more negative of the available potential signals and is identified as the $V_{ss}$ potential signal. The potential signal applied to the terminal 20 is the more positive of the available potential signals and is identified as the $V_{dd}$ potential signal.

Referring to FIG. 1B, there is shown the various combinations of logic signal configurations possible which can be applied to the present circuit and the corresponding output signals generated thereby. It should be noticed that the output signals represent the exclusive NOR output function.

In the first possible configuration of operation, the input logic signals A and B assume the logic states 1,1 respectively. The 1 or more positive potential signal is applied to the input terminal 12 and thereby applied to the gates of a plurality of MOS devices comprising an N channel device 22, a P channel device 24, a second N channel device 26 and a second P channel device 28. Additionally, the A input logic signal operates as a potential source to a source electrode of an N channel device 30. The B input logic signal available at the terminal 14 is applied to the gate electrode of a P channel MOS device 32 and to the gate electrode of the MOS device 30. Each of the enhancement devices s shown in FIG. 1A comprises source, gate, drain and substrate electrodes. The substrate electrodes are connected to one of the two potential sources available in the circuit and are used to identify the nature of the MOS device. More specifically, each of the substrate electrodes is identified with an arrowhead. The arrowhead pointing out from the device indicates a P channel device while the arrowhead pointing in towards the device identifies an N channel device such as the device 22. Additionally, the substrate electrode is connected to either the more positive potential signal available when it is a P channel device and it is connected to the more negative potential signal available when it is an N channel device. The one level of the A input signal is applied to the gate of the N channel device 22 turning device 22 on since the gate to source voltage is the supply difference. The positive level of the A input signal applied to the gate electrode of the device 24 turns the P channel device 24 off because the gate to source channel is a zero voltage signal. The turning on of the N channel device 22 places the negative potential signal at the drain electrode of the device 22 which is effectively applied over a line 34 to the gate electrode of a P CHANNEL MOS device 36. With the gate electrode of the MOS device 36 at the more negative level and the MOS device being a P channel device, this MOS device 36 turns on.

The B input signal level is at its more positive level and identified as a one level and it is applied to the gate electrode of the MOS device 32. Since the MOS device 32 is a P channel device, the positive signal applied to the gate electrode turns the device off. The positive potential applied to the gate electrode of the MOS device 30 since the MOS device 30 is an N channel device forms the channel region of the MOS device 30. Since the source electrode is at the more positive voltage level of the A input logic level which is the same as the B logic level applied to the gate electrode, current flows in the channel formed by the signal on the gate electrode allowing output node 16 to charge only toward the $V_{dd}$ level. The current path through device 30 is the secondary current path. The A input logic signal is applied to the gate electrode of the MOS device 26 which is an N channel device and as such a channel is formed between the source and drain regions of this device. The drain electrode is tied to the voltage level of the B input signal, the gate electrode has a positive voltage potential source applied thereto so a channel region is formed and the source electrode is connected to the output terminal and hence all conditions of conduction are satisfied and the output signal terminal charges to the level of the B input signal level. In the normal operation of MOS devices, the output signal terminal or output signal node has a capacitive value which is charged by current flow when the circuit operates. Although no such value of capacitance is shown, it is assumed that the output signal node represented by the output terminal 16 has a capacitive value to be charged by this current flow. The capacitive value is represented by the next sequential circuit or by a capacitor placed at the output terminal for this purpose. Referring to FIG. 5A, there is shown in the dotted line 50 the primary current path existing between the output terminal 16 and the B input terminal 14. The primary current path is split between the devices 36 and 26 into paths **50*a* and 50*b* since both devices are on or activated. The arrowhead on the dotted line indicates the path of current flow to charge or discharge the capacitance value at the output terminal node 16. A dotted line 52 shows the secondary current path existing between the output terminal 16 and the A input terminal 12 for the 1,1 logic state when the output node is charged to the level through a plurality of paths 50 and 52. Referring to line D of the chart of FIG. 5C, the logic levels A and B are at their more positive level represented by one condition and the $\overline{A}$ logic level is at the zero state. The $\overline{A}$ signal applied as the input signal to the gate electrode of the device 36 over the line 34** is generated in a circuit shown with reference to FIG. 1A by the inverter stage formed integral with the exclusive NOR circuitry shown in FIG. 1A. However, the $\overline{A}$ signal can also be furnished in other circuitry available in the normal logic environment and hence an inverter stage does not form a mandatory portion of the present invention. For example, a normal flip-flop stage has as its output signals an A and an $\overline{A}$ signal. A second flip-flop stage might have output signals identified as B and $\overline{B}$. Hence, to perform an exclusive NOR function with relation to these two flip-flop stages an inverter circuit would not be necessary since all the available signals are presently furnished by the two flip-flop stages.

Referring back to FIG. 1A, the next logic state of the circuit is to be described wherein the A input logic signal remains at the one level and the 8 logic signal changes to a more negative level represented at the zero state. With the B input signal at the more negative level and applied to the gate electrode of the MOS device 32, the MOS device 32 being a P channel device turns on. The device 30 being an N channel device turns off since the positive signal applied to the gate electrode does not form a channel region. The remaining MOS devices shown in the FIG. 1A are connected to the A input terminal 12 and are controlled thereby so these devices do not change their current state. When the B input logic level changes, the only devices directly changed are the MOS devices 30 and 32. Additionally, the B input logic level applied to the gate electrode of the device 30 is also applied as the drain potential level to the device 26 and hence the device 26 conducts in its expected manner charging the output terminal 16 toward the voltage level of the B input terminal 14 in the identical manner as described for the one-one logic state. Referring again to FIG. 5A, there is shown the identical primary charging path on line 50 representative of current flow for the one-zero logic state. Again, the output capacitive value of the output node 16 is discharged from the signal level of that available at the B input terminal 14 through devices 36 and 26.

Referring again to FIG. 1A, there is now described the changes in the conductive characteristics of the MOS devices shown in FIG. 1A in response to a change in the input logic signals to the zero-one state. With the input signal available at terminal 12, assuming the more negative voltage level identified as the zero level, the P channel MOS device 24 turns on and the N channel MOS device 22 turns off applying the $V_{dd}$ voltage level available at the terminal 20 over the $\bar{A}$ signal path 34 to the gate electrode of the MOS device 36. Just as the turn on of the N channel device 22, as previously described, brings the $V_{ss}$ signal to the gate electrode of the MOS device 36, the turning on of the P channel device 24 brings the $V_{dd}$ signal level available at the terminal 20 over the line 34 to the gate electrode of the MOS device 36. Since the P channel MOS device 36 receives a more positive voltage potential signal on its gate electrode it is effectively turned off. With a more negative signal level applied to the gate electrode of the N channel device 26, this N channel device 26 is effectively turned off. With the more negative level of the logic signal applied to the gate electrode of the P channel MOS device 28 the device 28 is in its on condition. The more positive potential level of the logic signal applied to the gate electrode of the P channel device 32 keeps the P channel device 32 off. The more positive potential level of the B input logic signal applied to the N channel MOS device 30 turns the device 30 on. Since the channel region of the device 30 is formed by the more positive potential level of the B input logic signal and since the drain electrode of the MOS device 30 is furnished by the A input logic level, the output terminal 16 discharges to the level of the A input potential level by way of a device 30. This discharging path is shown with reference to FIG. 4A, line 54. An inspection of FIG. 4C shows the various logic levels of the three signals applied to the circuit shown in FIG. 4A.

Referring again to FIG. 1A, the operation of the circuit in response to the zero-zero logic state of the input signals A and B respectively is now described. The voltage level of the A input logic signal does not change and hence the conditions of the MOS devices which receive the zero level of the A input signal do not change and the devices 32 and 30 which receive the potential level of the B input logic signal are the only devices which will be changed in this description. The B input signal level being at a more negative voltage potential when applied to the gate electrode of the P channel device 32 turns the P channel device on. The more negative signal level applied to the gate electrode of the N channel device 30 turns the MOS device 30 off. Since the more negative voltage level of the A input signal applied to the gate electrode of the P channel MOS device 28 turns the MOS device 28 on, there is now established a charging path to the output signal terminal 16 which passes through the devices 28 and 32 to the more positive source of potential available at the terminal 20. This charging path is shown with reference to FIG. 3A. An inspection of FIG. 3C shows the potential level of the three input signals applied to the circuit in the logic state zero-zero. Referring generally to FIGS. 3A, 4A and 5A, it is important to point out that one active device delay is in the charging path for three of the logic states represented by FIGS. 5A and 4A. In this manner, for these three logic states there is only one charge delay in the present circuit. Referring to FIG. 3A, there is shown two MOS devices in the charge path 56 so circuit 3A represents two charge delay times in circuit operation. It is important that the charge delay times be kept to a minimum and the embodiments shown with reference to FIGS. 5A and 4A and represented by FIG. 1A represents only one charge delay time in comparison to the normal circuit which has two charge delay times. Referring to FIG. 2, there is shown the exclusive NOR circuit of a design of the present invention having the B input signal path formed with an inverter stage. Since the circuit of FIG. 2 is a mirror image of that shown in FIG. 1A with the only change being of the placement of the inverter and device 36 on the B input side in comparison with the inverter and device 36 being on the A input side with respect to FIG. 1A, the circuit shown in FIG. 2 operates identically with that shown in FIG. 1A. Like devices in FIG. 2 are identified with the same numerals as shown with reference to FIG. 1A except raised to the prime.

Referring to FIG. 5B, there is shown a secondary path charging circuit represented by a line 58, and a primary discharging path represented by a line 60 when the A and B inputs are in the one, one states. When the A and B inputs are in the 0,1 states respectively, the primary path is the only operative path. The primary path 60 is split by the devices 36′ and 30′, as shown with reference to FIG. 5B, into paths **60*a* and 60*b***.

FIG. 4B shows a discharging path 62 from the A input level, having a split portion **62*a* and 62*b* through the devices 30′ and 36′ when the $\bar{B}$ signal is at the zero level. FIG. 3B shows a charge path 64 from the output terminal 16 to the first voltage level $V_{dd}$ through two device delays represented by the devices 28′ and 32′**.

FIG. 6 shows the ON-OFF states of each device shown in FIGS. 1A and 3 for each of the logic states respectively.

While the invention has been particularly shown and described with reference to a preferred embodiment thereof, it will be understood by those skilled in the art that changes in form and details may be made therein without departing from the spirit and scope of the invention.

What is claimed is:

1. A CMOS exclusive NOR circuit comprising:

a source of potential having a first voltage level and a second voltage level and said second voltage level being more negative than said first voltage level;

a first input logic terminal and a second second input terminal;

a first logic signal applied to said first terminal and a second logic signal applied to said second terminal;

an output terminal;

a first current charging and discharging path including said output terminal;

a first P-channel, enhancement mode, MOSFET having source, drain, gate and substrate terminals and said gate terminal being responsive to said first logic signal and said drain terminal being connected to said output terminal;

a second P-channel enhancement mode, MOSFET having source, drain, gate and substrate terminals and having said drain terminal of said second P-channel MOSFET connected to the source terminal of said first P-channel MOSFET and said source of said second P-channel MOSFET connected to said first voltage level;

said substrate terminal of said first P-channel MOSFET being connected to said substrate terminal of said second P-channel MOSFET and both being connected to said first voltage level;

said gate terminal of said second P-channel MOSFET being responsive to said second logic signal; and said first logic signal and said second logic signal being equal to said second voltage level whereby, said first P-channel MOSFET and said second P-channel MOSFET are activated for connecting said output terminal to said first voltage level and charge carriers have a charge path from said first voltage level.

2. A CMOS exclusive NOR circuit as recited in claim 1 and further comprising;

a capacitive device connected to said output terminal for being charged to the voltage level of said first voltage level.

3. A CMOS exclusive NOR circuit as recited in claim 1, and further comprising;

a second charging and discharging path comprising a first N-channel enhancement mode MOSFET having source, drain, gate and substrate terminals and having said source terminal connected to said output terminal, and said drain terminal connected to said first input logic signal terminal and said gate terminal being responsive to said second input logic signal, and said substrate terminal being connected to said second voltage level; and said first logic signal being at said second voltage level and said second logic signal being at said first voltage level, whereby;

said first N-channel MOSFET is activated for forming a discharging path from said output terminal to said first input terminal.

4. A CMOS exclusive NOR circuit as recited in claim 3, and further comprising:

a capacitive device connected to said output terminal for discharging to said voltage level of said first input logic signal.

5. A CMOS exclusive NOR circuit as recited in claim 3, and further comprising:

a control signal being the complement of one of said logic signals;

a third charging and discharging path comprising a third P-channel, enhancement mode MOSFET having source, drain gate and substrate terminals and said drain terminal being connected to said drain terminal of said first N-channel MOSFET, and said source terminal being connected to said output terminal, and said substrate terminal being connected to said first voltage level, and said gate electrode being responsive to said complement signal of said second logic signal; and said first logic signal being at said second voltage level and said second logic signal being at said first voltage level, whereby said first N-channel MOSFET is activated for forming a discharging path from said output terminal to said first input terminal.

6. A CMOS exclusive NOR circuit as recited in claim 5, and further comprising:

a capacitive device connected to said output terminal for discharging to said voltage level of said first input logic signal.

7. A CMOS exclusive NOR circuit as recited in claim 6, wherein said third P channel MOSFET being activated by said complement signal of said second logic input signal for forming a parallel current path with said first N channel MOSFET.

8. A CMOS exclusive NOR circuit as recited in claim 5, wherein said second logic signal being at said first voltage level, whereby; said first N channel MOSFET and said third P channel MOSFET are simultaneously activated for sharing said current in said third charging and discharging path from said output terminal to said first input terminal.

9. A CMOS exclusive NOR circuit as recited in claim 8, and further comprising:

a capacitive device connected to said output terminal for being discharged to a plurality of second voltage levels.

10. A CMOS exclusive NOR circuit as recited in claim 3, and further comprising:

a control signal being the complement of one of said logic signals;

a third charging and discharging path comprising a second N-channel, enhancement mode, MOSFET having source, drain, gate and substrate terminals and said drain terminal being connected to said second logic signal input terminal, and said gate terminal being connected to said first logic signal input terminal, and said substrate terminal being connected to said second voltage level and said source terminal being connected to said output terminal; and a third P-channel, enhancement mode, MOSFET having source, drain, gate and substrate terminals and said source terminal being connected to said second logic signal input terminal, and said drain terminal being connected to said output terminal, and said substrate terminal being connected to said first voltage level, and said gate terminal being connected to said complement signal of said first logic signal; and said first logic signal being now at said one voltage level, whereby; said second N-channel MOSFET and said third P channel MOSFET are activated for forming a discharging path from said second logic signal input terminal to said output terminal.

11. A CMOS exclusive NOR circuit as recited in claim 10, and further comprising:

a capacitive device connected to said output terminal for discharging to the voltage level of said second input logic signal.

12. A CMOS exclusive NOR circuit as recited in claim 10, wherein:

said second logic signal being at said second voltage level.

13. A CMOS exclusive NOR circuit as recited in claim 10, and further comprising:

a capacitive device connected to said output terminal for discharging to the voltage level of said second input logic signal.

14. A CMOS exclusive NOR circuit as recited in claim 11, and further comprising:

a fourth charging path comprising;

said first N-channel MOSFET being activated and forming a charging path to said first input logic level terminal from said output terminal whereby said capacitive device is discharged to a plurality of second voltage levels.

15. A CMOS exclusive NOR circuit as recited in claim 5, and further comprising:

a fourth charging and discharging path comprising, a second N-channel, enhancement mode, MOSFET having source, drain, gate and substrate terminals and having its drain terminal connected to said second logic signal input terminal, and having its source terminal connected to said output signal output terminal, and having its substrate terminal connected to said second voltage level, and having its gate terminal connected to said first logic signal input terminal; and said first logic signal now being at said first voltage level, whereby said second N-channel MOSFET being activated for forming said sixth charging path between said second logic signal input terminal and said output terminal.

16. A CMOS exclusive NOR circuit as recited in claim 15, and further comprising:

a capacitive device connected to said output terminal for charging to the voltage level of said second input logic signal.

17. A CMOS exclusive NOR circuit as recited in claim 15 wherein:

said second logic signal being at said second voltage level; and said complement of said second logic signal being at said first voltage level for turning off said third P-channel MOSFET.

18. A CMOS exclusive NOR circuit as recited in claim 17, and further comprising:

a capacitive device connected to said output terminal for discharging to said voltage level of said second input logic signal.

19. A CMOS exclusive NOR circuit as recited in claim 10, wherein said complement signal of said first logic signal being generated by an inverter circuit formed integral therewith, said inverter circuit comprising:

a fourth P-channel, enhancement mode, MOSFET having source, drain, gate and substrate terminals and said source terminal being connected to said first voltage level, and said gate terminal being connected to said first logic signal input terminal and said substrate terminal being connected to said first voltage level; and a third N-channel, enhancement mode, MOSFET having source, drain, gate and substrate terminals, and said drain terminal being connected to a junction formed by said drain terminal of said fourth P-channel MOSFET and said gate terminal of said third channel MOSFET and said substrate terminal being connected to said drain terminal and both being connected to said second voltage level, and said gate terminal being connected to said first logic signal input terminal, whereby; said complement signal of said first logic signal is available at said first junction.

20. A CMOS exclusive NOR circuit as recited in claim 15, wherein said complement signal of said second logic signal being generated by an inverter circuit formed integral therewith, said inverter circuit comprising:

a fourth P-channel, enhancement mode, MOSFET, having source, drain, gate and substrate terminals and said source terminal being connected to said first voltage level, and said gate terminal being connected to said second logic signal input terminal, and said substrate terminal being connected to said first voltage level; and a third N-channel, enhancement mode MOSFET having source, drain, gate and substrate terminals, and said drain terminal being connected to a second junction formed by said drain terminal of said fourth P-channel MOSFET and said gate terminal of said third P-channel MOSFET and said substrate terminal being connected to said source terminal of said same MOSFET and both being connected to said second voltage level, and said gate terminal being connected to said second logic signal input terminal, whereby; said complement signal of said second logic signal is available as said second junction.

* * * * *